United States Patent
Malladi et al.

[11] Patent Number: 5,780,930
[45] Date of Patent: Jul. 14, 1998

[54] METHOD FOR DIRECT ATTACHMENT OF AN ON-CHIP BYPASS CAPACITOR IN AN INTEGRATED CIRCUIT

[75] Inventors: Deviprasad Malladi, Campbell; Shahid S. Ansari, Milpitas; Eric Bogatin, San Jose, all of Calif.

[73] Assignee: Sun Microsystems, Inc., Palo Alto, Calif.

[21] Appl. No.: 792,088

[22] Filed: Jan. 31, 1997

Related U.S. Application Data

[63] Continuation of Ser. No. 353,439, Dec. 9, 1994, abandoned.

[51] Int. Cl.$^6$ .......................... H01L 23/48; H01L 23/52; H01L 29/40; H01G 4/005
[52] U.S. Cl. .......................... 257/777; 257/532; 257/535; 257/723; 361/303; 361/306.1; 438/620
[58] Field of Search .......................... 257/777, 532, 257/535, 763, 665; 361/303, 306.1

[56] References Cited

U.S. PATENT DOCUMENTS

| | | | |
|---|---|---|---|
| 4,598,307 | 7/1986 | Wakabayashi et al. | 257/665 |
| 5,027,995 | 7/1991 | Karl et al. | 228/111 |
| 5,200,642 | 4/1993 | Long | 257/724 |
| 5,258,329 | 11/1993 | Shibata | 437/195 |
| 5,306,952 | 4/1994 | Matsuura et al. | 257/763 |

OTHER PUBLICATIONS

Article entitled "The Close Attached Capacitor: A Solution to Switching Noise Problems", by S. H. Hashemi, et al, IEEE Publication 0148-6411/92$03.00 (1992) pp 1056–1063 IEEE Log 920345.

"Electronic Packaging and Interconnection Handbook", p. 1.48, C. Harper.
"The Close Attached Capacitor: A Solution to Switching Noise Problems", pp. 2–9, Hashemi et al.

*Primary Examiner*—Mahshid D. Saadat
*Assistant Examiner*—Jhihan B. Clark
*Attorney, Agent, or Firm*—Flehr Hohbach Test Albritton & Herbert LLP

[57] ABSTRACT

Switching noise at integrated circuit $V_{DD}$ and $V_{SS}$ metal traces is reduced by minimizing lead inductance in on-chip bypass capacitors. For each on-chip bypass capacitor, a pair of $V_{DD}$-carrying and $V_{SS}$-carrying metal traces is formed, these traces having regions spaced-apart laterally a distance $\Delta X$ corresponding to lateral separation of the bypass capacitor connecting pads. For each bypass capacitor, column-shaped openings, spaced-apart distance $\Delta X$, are formed through the passivation and inter-metal oxide layers, as needed. These openings expose and access regions of the pair of spaced-apart metal traces carrying $V_{SS}$ and $V_{DD}$. These openings, which may be formed after the IC has been fabricated, preferably are formed using focussed ion beam technology ("FIB"). Alternatively, these openings may be formed using masking and etching steps. The column-shaped openings are then made into conductive columnar elements, preferably using FIB deposition of tungsten or platinum. Conductive element pads are formed atop the conductive columnar elements at the outer surface of the IC passivation layer. The bypass capacitors are then attached to the IC, and the capacitor connecting pads are electrically connected to the respective conductive element pads using conductive epoxy or other conductive bond material. This direct attachment of the on-chip bypass capacitors reduces effective capacitance lead inductance and improves attenuation of on-chip switching noise.

20 Claims, 4 Drawing Sheets

METHOD FOR DIRECT ATTACHMENT OF AN ON-CHIP BYPASS CAPACITOR IN AN INTEGRATED CIRCUIT

This is a continuation of application Ser. No. 08/353,439 filed 9 Dec. 1994, now abandoned.

FIELD OF THE INVENTION

This invention relates to reducing switching noise within integrated circuits, and more particularly to methods for providing integrated circuits with bypass capacitors to improve on-chip power supply bypassing and reduce switching noise.

BACKGROUND OF THE INVENTION

Integrated circuits ("ICs") are fabricated layer-by-layer on a semiconductor substrate, with bond wires coupling $V_{SS}$, $V_{DD}$, and input/output signals between pads on the upper surface of the substrate and the IC package. Generally there will be many $V_{SS}$ and $V_{DD}$ pads on the periphery of the IC. For example, an IC having 300 pin-outs may have 100 peripheral bonding pads dedicated to $V_{SS}$ and/or $V_{DD}$. Bond wires couple these peripheral pads to on-chip $V_{SS}$ and $V_{DD}$ power rails.

With reference to FIG. 1, using techniques well known in the art of semiconductor fabrication, metal-oxide-semiconductor ("MOS") transistors, bipolar transistors, diodes and other devices 10 are fabricated and combined to form an IC, shown generically as 12, on a substrate 14. Typically, portions of some of the devices and some interconnections are frequently formed using one more levels of polysilicon. For example, in FIG. 1, a MOS transistor gate electrode 16, and a resistor 18 are depicted as being fabricated from a first layer of polysilicon.

Other interconnections to IC 12 may be made using overlying levels of metallization, for example metal 1 layer trace 20, metal 2 layer trace 22 and perhaps metal 3 layer trace 24. For an IC with three layers of metallization various metal 1 layer traces usually are coupled to the upper power supply $V_{DD}$, the metal 2 layer traces carry signals, and various metal 3 layer traces are coupled to the lower power supply $V_{SS}$ (usually ground). For an IC with only two layers of metallization, various metal 1 layer traces are typically coupled to $V_{SS}$, while some metal 2 layer traces will carry $V_{DD}$ and others will carry signals. These generalizations are not absolute, however, and $V_{DD}$ and/or $V_{SS}$ traces may be formed at any level of metallization in an IC, including a common level of metallization.

As shown in FIG. 1, an inter-level dielectric isolation ("ILD") layer 26 is formed between the metal 1 layer 20 and the uppermost polysilicon layer, here comprising segments 16 and 18. The ILD layer 26 typically includes boron phosphorus silicate glass ("BPSG") and insulates the polysilicon layer segments from metal 1 segments.

Inter-metal oxide ("IMO") layers 28, 30 are formed between adjacent levels of metallization. To help smooth out the otherwise bumpy topology, the IMO layers typically include spun-on-glass ("SOG"), which is applied in liquid form.

A relatively hard, outermost passivation layer 32 protects the underlying layers comprising the IC. Typically, passivation layer 32 includes silicon nitride and is formed using plasma enhanced chemical vapor deposition techniques.

Electrical connections between the various metallization layers 20, 22, and (if present) 24 and regions of IC 12 are made using conductive vias, e.g., 34, 36, which vias are depicted as terminating at bond pads 38, 40. It is understood that there will be many $V_{SS}$ traces, all of which will be electrically coupled together and to $V_{SS}$ one or more peripheral $V_{SS}$ bonding pads and bond wires. Similarly, there will be many $V_{DD}$ traces, all of which will be electrically coupled together and to $V_{DD}$ through one or more peripheral $V_{DD}$ bonding pads and bond wires.

For ease of comprehension, FIG. 1 shows bond wires 42, 44 respectively connecting $V_{SS}$ and $V_{DD}$ to pads 38 and 40 and (in this example) to $V_{SS}$ trace 24 and $V_{DD}$ trace 20. In practice, however, bond wires 42 and 44 will be connected to peripheral bond pads, whereas pads 38 and 40 may be formed other than on the periphery of IC 12. Further, FIG. 1 does not show other vias that may be used to couple signals from various metal traces to the surface of the passivation layer 32, wherefrom the signals may be coupled elsewhere.

Thus, in the three metal layer embodiment of FIG. 1, it is understood that various of the metal 1 level traces typically will be coupled to $V_{DD}$, and that various of the metal 3 level traces typically will be coupled to $V_{SS}$. When IC 12 is actually used, power supplies providing $V_{SS}$ and $V_{DD}$ will be coupled to connector pins (not shown) on the package encapsulating IC 12. Connections from these pins are made with bond wires 42, 44 to peripheral $V_{SS}$ and $V_{DD}$ bonding pads and power rails on IC 12.

Those skilled in the art of circuit design will appreciate that reliable IC operation dictates that the $V_{SS}$ and $V_{DD}$ voltage levels seen by IC 12 be as noise-free as possible. By noise-free it is meant that ideally the $V_{SS}$ and $V_{DD}$ signals on the IC traces are pure DC, with no AC transient components.

Unfortunately, AC switching noise components are generally present. These noise components can arise from imperfect switching of complementary MOS inverters, wherein and pull-down transistors are simultaneously on during output state transitions. Further, unavoidable inductance (L) effectively in series with IC bond wire leads, e.g., leads 42, 44 can produce ground bounce. Ground bounce can produce current slewrate (L di/dt) changes in voltages coupled to IC 12, including $V_{SS}$ and $V_{DD}$. Crosstalk between adjacent signal traces can also couple switching noise to traces carrying $V_{SS}$ or $V_{DD}$.

It is known to reduce switching noise by providing a bypass capacitor 50 at the surface of an IC, coupled between IC pads carrying $V_{SS}$ and $V_{DD}$. Several techniques for providing on-chip bypassing are described in the reference *The Close Attached Capacitor: A Solution to Switching Noise Problems* by S. H. Hashemi, et al. 01486411/92 p. 1056–1063 (1992).

Bypass capacitor 50 is frequently in the 1 nF to 100 nF range, and may occupy an area of perhaps 0.050" by 0.1" (1.3 mm by 2.6 mm). Typically, bond wires 52, 54 couple capacitor 50 to IC bonding pads, e.g., 38, 40. Unfortunately, these capacitor bond wires have an excessively large effective series inductance of perhaps 2–5 nH.

Thus, the effectiveness of the bypass capacitor is degraded by the series inductance contributed by the capacitor bond wires. As a result, excessive switching noise can remain on the $V_{DD}$ and/or $V_{SS}$ IC traces.

In short, there is a need for a more effective method of providing on-chip capacitor bypassing to reduce switching noise within an integrated circuit. Preferably such method should be implemented using standard IC fabrication processes.

The present invention provides such a method.

SUMMARY OF THE PRESENT INVENTION

Switching noise appearing at integrated circuit $V_{DD}$ and $V_{SS}$ metal traces is reduced by minimizing lead inductance associated with on-chip bypass capacitors. For each on-chip bypass capacitor a pair of metal traces coupled to $V_{DD}$ and to $V_{SS}$ for the IC are formed. These traces are spaced-apart laterally a distance corresponding to the lateral separation of connecting pads on the bypass capacitor.

Column-shaped openings must be formed through the IC to gain access to the pair of spaced-apart metal traces coupled to $V_{DD}$ and $V_{SS}$. These column-shaped openings are formed through the passivation and inter-metal oxide layers of the completed IC, as needed. On a prototype or small production run basis, the column-shaped openings are formed using focussed ion beam technology ("FIB"). However, FIB is a slow process and on a large production run basis, the column-shaped openings preferably are formed using a masking layer (that is later removed) and etching, for example reactive ion etching.

Regardless of how the column-shaped openings are formed, the openings are next converted into column-shaped electrically conductive elements. These columnar conductive elements preferably are formed using FIB deposition of platinum or tungsten. Alternatively, the openings may be converted into conductive elements using sputtering, or by filling the openings with deposition of silver, aluminum, or doped polysilicon. Conductive element pads are formed atop the column-shaped conductors, e.g., atop the upper surface of the outermost passivation layer, preferably using FIB.

A bypass capacitor is then mounted at the upper surface of the IC. The capacitor's connecting pads are electrically and mechanically coupled to the respective conductive element pads, using conductive adhesive or other conductive bonding. In this manner, the on-chip bypass capacitor is directly coupled to the metal traces carrying $V_{DD}$ and $V_{SS}$, with substantial reduction in effective capacitance lead inductance. The net result is better attenuation of on-chip switching noise than if prior art techniques for mounting an on-chip bypass capacitor were used.

Other features and advantages of the invention will appear from the following description in which the preferred embodiments have been set forth in detail, in conjunction with the accompanying drawings.

DESCRIPTION OF THE PREFERRED EMBODIMENT

Figure 1:
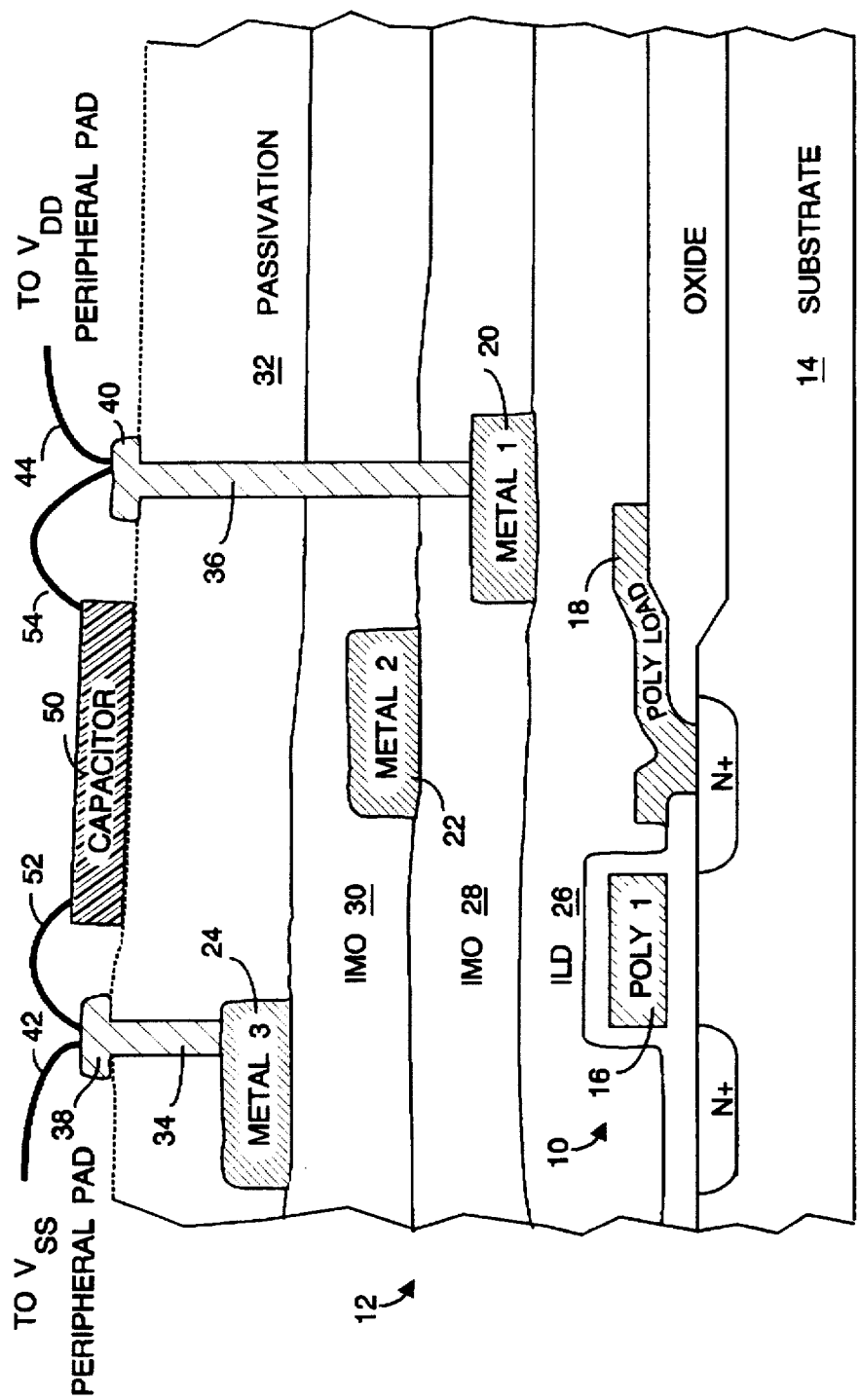
FIG. 1 is a cross-sectional view of a three metal layer integrated circuit with an on-chip bypass capacitor, according to the prior art.
Figure 2A:
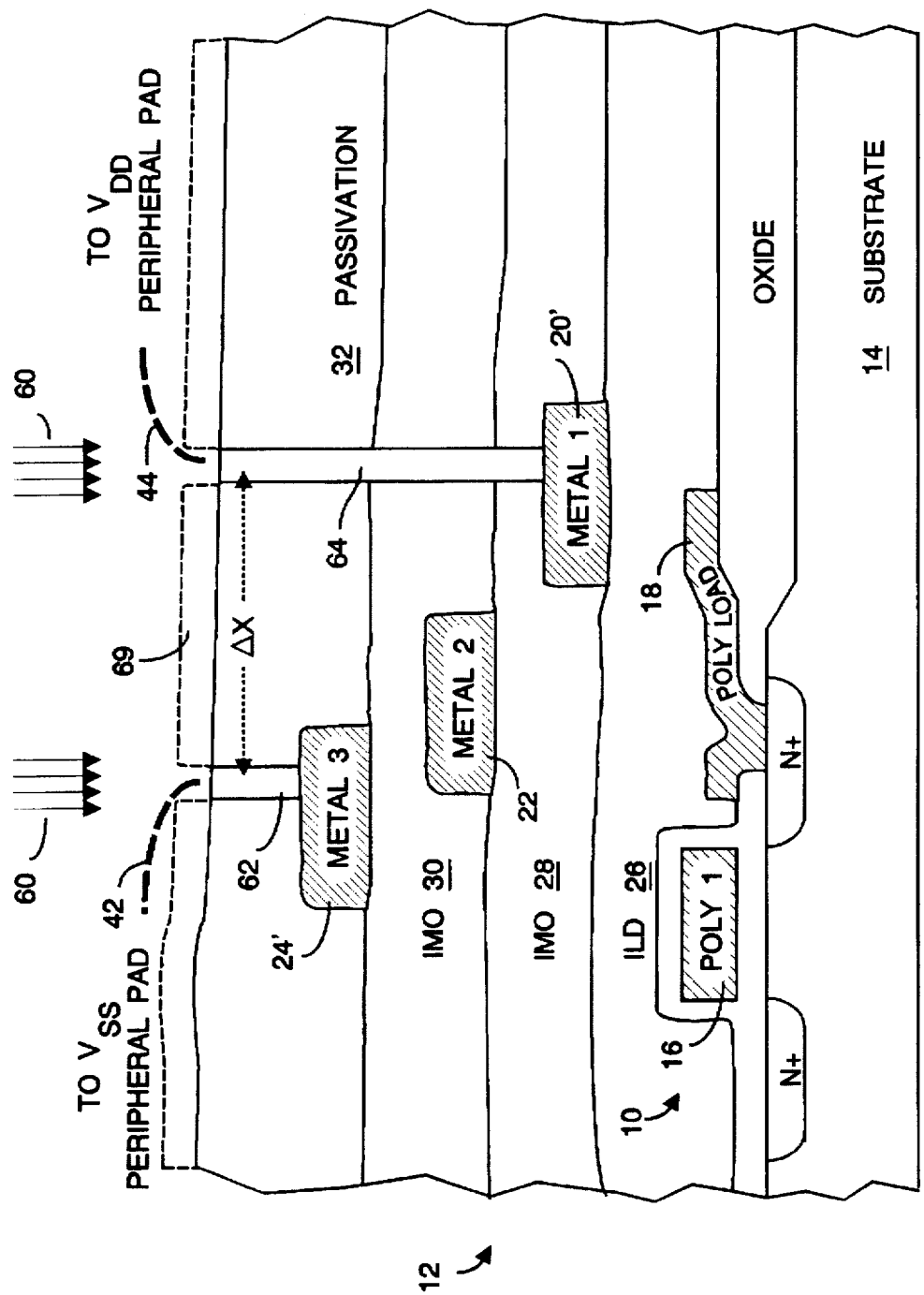
FIG. 2A is a cross-sectional view of a three metal layer integrated circuit depicting formation of column-shaped openings to access metal traces carrying $V_{SS}$ and $V_{DD}$, according to the present invention.

FIG. 2A depicts an integrated circuit 12 similar to what was described with respect to FIG. 1, wherein three layers of metal traces 20', 22, and 24' are shown. Reference numbers common to FIG. 1, FIG. 2A and the other figures herein depict similar elements, e.g., layer 26 is a layer of inter-level dielectric material. Further, FIG. 2A, like the other figures herein, is not drawn to scale.

In FIG. 2A, various metal 1 level traces are understood to be coupled to at least one peripheral $V_{DD}$ pad on IC 12, and various metal 3 level traces are understood to be coupled to at least one peripheral $V_{SS}$ pad on IC 12. Thus, bond wires 42 and 44 respectively couple at least one peripheral $V_{SS}$ pad and at least one peripheral $V_{DD}$ pad to the $V_{SS}$ traces, including trace 24', and to the $V_{DD}$ traces, including trace 20'.

Bond wires 42 and 44 are shown in phantom to depict that they need not be located directly above traces 24' and 20', or be directly connected to these traces. It suffices that traces 20' and 24' are coupled to peripheral $V_{DD}$ and $V_{SS}$ pads, and such coupling can result from these traces being coupled to other traces that are connected to such pads. Although FIG. 2A depicts a $V_{DD}$-carrying trace at the metal 1 level, and a $V_{SS}$-carrying trace at the metal 3 level, it is understood that these traces (as well as signal-carrying traces) could be formed on other levels, or even on the same metallization level.

In forming IC 12, a portion of at least one $V_{DD}$ trace and a portion of at least one $V_{SS}$ trace, e.g., traces coupled respectively to a peripheral $V_{DD}$ pad and to a peripheral $V_{SS}$ pad, are spaced-apart laterally a distance $\Delta X$. The distance $\Delta X$ corresponds to the separation between an on-chip capacitor's connecting pads. (This spatial relationship will be described more fully with reference to FIG. 2B.) In FIG. 2A, these two spaced-apart trace portions are 20' and 24', which traces happen to be located at different levels, namely metal 1 and metal 3.

As will now be described, these spaced-apart $V_{DD}$ and $V_{SS}$ carrying traces 20', 24' must be accessed to facilitate direct electrical coupling to the on-chip bypass capacitor that will be mounted on the passivation layer 32.

Access to the spaced-apart traces may be gained after IC 12 has been fully fabricated, and can even occur post-packaging. If IC packaging has occurred, the typically ceramic IC package may be heated and the upper package cap unsoldered and temporarily removed, providing access to IC 12, as shown in FIG. 2A. (The upper package cap may be reattached by resoldering, after attachment of the on-chip bypass capacitor(s).)

FIG. 2A depicts column-shaped openings 62, 64, spaced-apart a distance $\Delta X$, extending from at least the upper surfaces of laterally spaced-apart $V_{DD}$ and $V_{SS}$ carrying traces 20', 24', to the upper surface of the upper passivation layer 32. The openings tend to have a somewhat rectangular cross-sectional area, ranging from perhaps 1 $\mu m^2$ to about 20 $\mu m^2$, although other dimensions may be used. The vertical length of columns 62, 64 depends upon the metallization levels at which the spaced-apart $V_{DD}$-carrying and $V_{SS}$-carrying traces are formed, and upon the thicknesses of the passivation and any inter-metal oxide layers 32, 30, 28. Generally the vertical length of the columns will be in the micrometer range.

On a prototype or small production run basis, column-shaped openings 62 and 64 preferably are formed using ion beam ("FIB") technology, depicted generally in FIG. 2A as arrows or beams 60. The vertical depths of these openings must be sufficient to reach at least the upper surface of the spaced-apart target $V_{DD}$ and $V_{SS}$ traces, here 20' and 24'. Thus, in FIG. 2A, the column-shaped openings 62, 64 are FIB-drilled through the passivation layer 32 and, in the case of opening 64, through inter-metal oxide layers 30 and 28.

However, FIB-drilling openings 62 and 64 is time consuming, especially if multiple pairs of such openings are to be formed for multiple on-chip capacitors. FIB-drilling forms each opening, one at a time, with a back-and-forth milling type operation. However, FIB-drilling openings 62 and 64 is very useful on a prototype basis because the precise location of the on-chip bypass capacitor(s) may not be known until prototype fabrication and testing has been completed.

Once it is known where the on-chip bypass capacitor(s) will be located, the column-shaped openings 62 and 64 may more rapidly be formed using masks and etching in large scale production runs. For example, a masking layer 69 (shown in phantom) may be formed atop passivation layer 32. Etching, for example reactive ion etching, (shown generically as arrows 60) then occurs through openings defined in the mask, forming the spaced-apart column-shaped openings 62 and 64. Mask 69 can define a plurality of mask openings through which etching occurs. In this fashion, access may be simultaneously provided to a plurality of desired spaced-apart traces (e.g., for use with multiple on-chip capacitors), as well as to regions of IC 12 unrelated to the present invention, as needed.

Figure 2B:
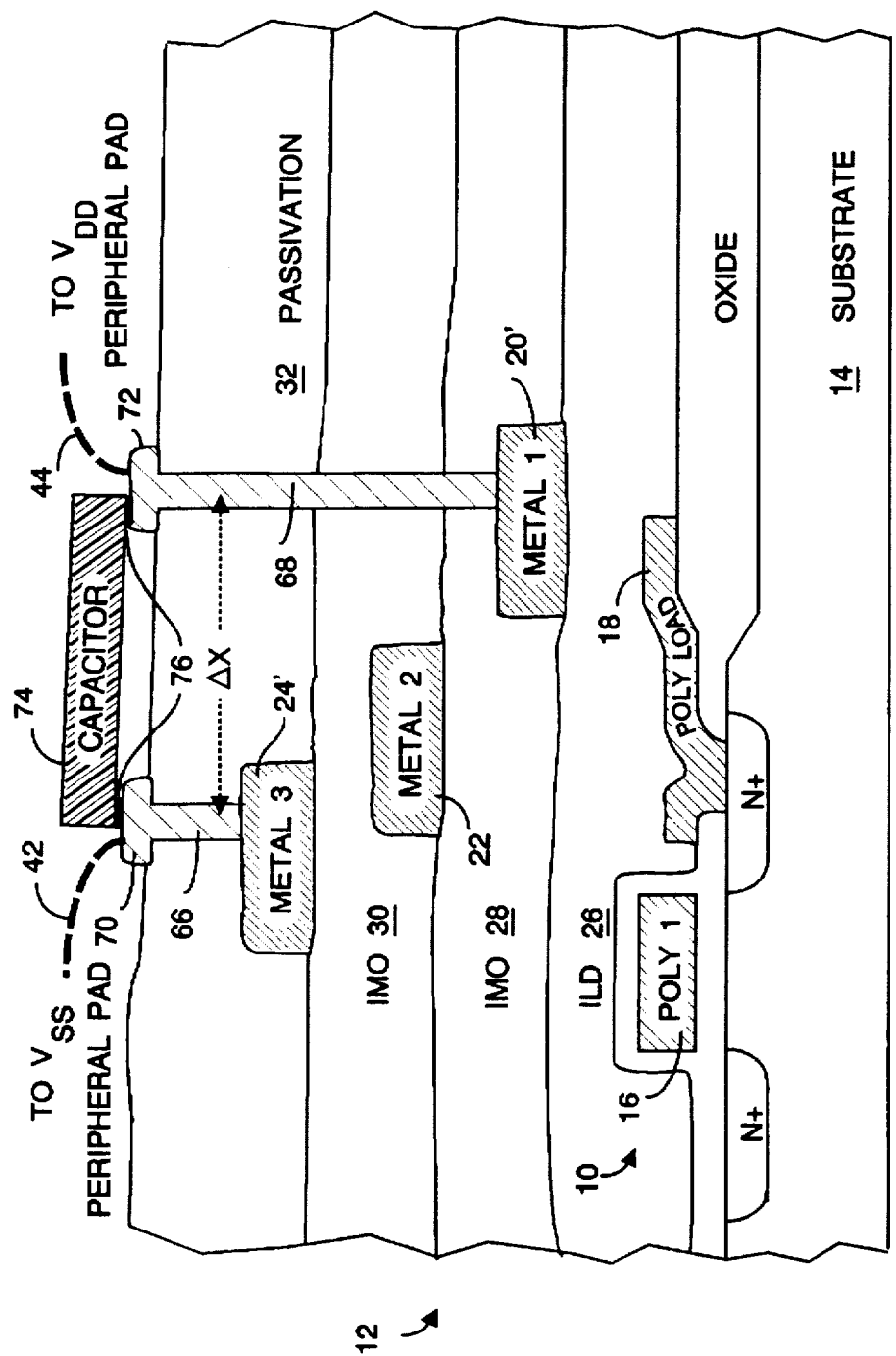
FIG. 2B is a cross-sectional view of the integrated circuit of FIG. 2A, depicting the column-shaped openings filled with conductive material to form conductive columnar elements having conductive element pads to which an on-chip bypass capacitor is attached, according to the present invention.

Reference is now made to FIG. 2B. Regardless of how they were formed, the column-shaped openings 62, 64 must be made electrically conductive to form via-like columnar electrically conductive elements 66 and 68. Preferably FIB is used to deposit platinum or tungsten within the openings 62, 64 to form elements 66 and 68. Alternatively, openings 62 and 64 may be made conductive using blanket sputtering and etch-back, or deposition filling with aluminum or silver, or deposition filling with doped polysilicon to form elements 66 and 68. These various techniques are known in the art, and for that reason details will not be presented herein.

At this juncture, the via-like conductive columnar elements 66, 68 are spaced-apart a lateral distance $\Delta X$ and are in electrical communication with spaced-apart $V_{DD}$-carrying and $V_{SS}$-carrying metal traces 20', 24'.

As shown in FIG. 2B, electrically conductive element pads 70, 72 are also formed in electrical communication with the conductive elements 66, 68. When formed, these element pads will be used to make electrical connection to the on-chip bypass capacitor. These pads preferably are formed using FIB deposition of platinum or tungsten, although other known techniques could be used instead, including sputtering and etch-back. If masking layer 69 was formed, it may now be removed.

For ease of illustration, FIG. 2B shows a single metal 1 $V_{DD}$ trace 20'and a single metal 2 $V_{SS}$ trace 24', although in practice many $V_{DD}$-coupled and $V_{SS}$-coupled traces may be present. As noted, bond wires 42 and 44 (shown in phantom) are connected to peripheral $V_{SS}$ and $V_{DD}$ pads, respectively, which peripheral pads are via-coupled to $V_{SS}$ and $V_{DD}$ traces. Because pads 70 and 72 will generally be formed interior to the IC periphery, the bond wires 42 and 44 usually will not be connected directly to these pads. Nonetheless, pads 70 and 72 will be electrically coupled to $V_{SS}$ pads and $V_{DD}$ pads through conductive elements 66 and 68, through traces 24' and 20' and other traces (not shown) that are via-connected to peripheral $V_{SS}$ and $V_{DD}$ bond pads, respectively.

In FIG. 2B, a bypass capacitor 74 having capacitor connecting pads 76 is electrically coupled to pads 70, 72. This coupling preferably is achieved with conductive adhesive (e.g., conductive epoxy) or other conductive bonding. Alternative techniques for achieving an electrical connection between the capacitor pads 76 and the IC conductive element pads 70, 72 may of course be used. Applicants point out that in practice if soldering is used to achieve the electrical connection, it will be difficult to attach solderable pads 70, 72 to elements 66 and 68, especially if these elements have been formed from doped polysilicon.

For purposes of enhancing mechanical stability, additional adhesive or other mounting means may be used to further secure capacitor 74 to the surface of IC 12.

As shown in FIG. 2B, on-chip capacitor 74 is in direct and preferably low impedance electrical communication with the spaced-apart $V_{DD}$ and $V_{SS}$ traces 20' and 24', and effectively bypasses $V_{DD}$ to $V_{SS}$ for IC 12. Capacitor 74 makes direct electrical connection to conductive elements 66, 68 without using bond wires such as wires 52, 54 (shown in FIG. 1). This mounting reduces the effective inductance between capacitor 74 and conductive elements 66, 68 by about 50% or more, relative to the typically 2–5 nH inductance present in the prior art configuration of FIG. 1. As a result, switching noise within the IC is more effectively bypassed, relative to the performance of the prior art configuration of FIG. 1.

Bypass capacitor 74 is typically in the 1 nF to 100 nF range, and may occupy an area of perhaps 0.050" by 0.1" (1.3 mm by 2.6 mm), although other sized capacitors may be used. A planar view of FIG. 2B would show a substantial portion of the IC 12 surface area covered by one or more bypass capacitors 74. The lateral distance $\Delta X$ separating at least portions of the $V_{DD}$ and $V_{SS}$ trace pair (here 20', 24') coincides with the lateral dimension of capacitor 74. On-chip capacitors such as capacitor 74 are commercially available, for example from AVX, Inc.

It will be appreciated that more than one on-chip capacitor 74 may be used to provide bypassing for IC 12. For each additional on-chip bypass capacitor, an additional pair of appropriately spaced-apart $V_{DD}$ and $V_{SS}$ traces will be provided, with additional pairs of suitably spaced-apart conductive elements and element pads.

Figure 3:
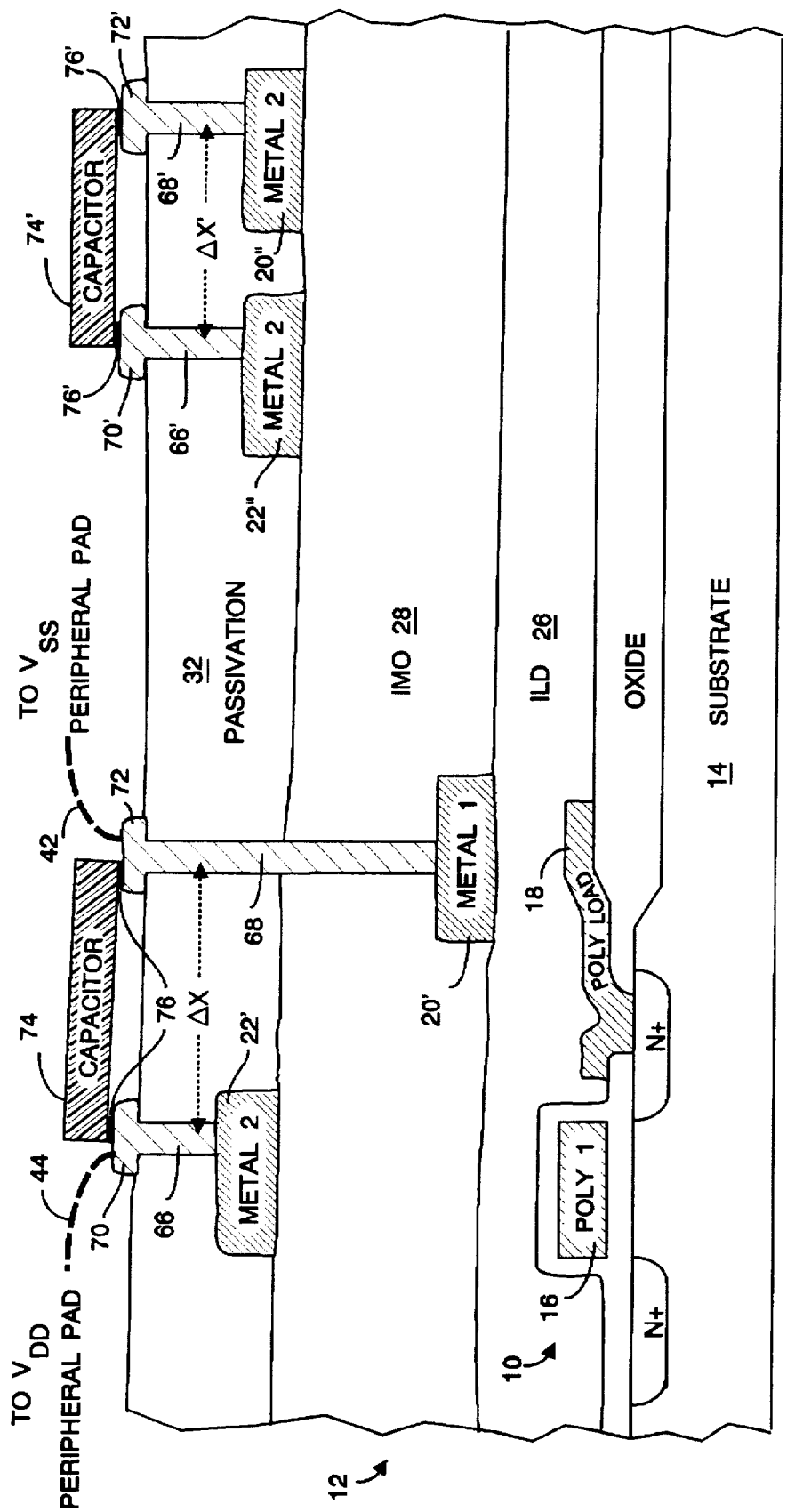
FIG. 3 is a cross-sectional view of a two metal layer integrated circuit, depicting attachment of two on-chip bypass capacitors to conductive element pads coupled to metal traces carrying $V_{DD}$ and $V_{SS}$, according to the present invention.

Such a multiple on-chip capacitor configuration is shown in FIG. 3, wherein on-chip bypass capacitors 74, 74' are used with a two metallization layer IC 12. In FIG. 3, assume that the $V_{DD}$-carrying metal traces are metal 2 trace 22' and metal 2 trace 22", and that the $V_{SS}$-carrying metal traces are metal 1 trace 20' and metal 2 trace 20". The relevant spaced-apart metal trace pairs are thus traces 22' and 20', which are spaced apart a distance $\Delta X$, and traces 22" and 20", which are spaced apart a distance $\Delta X'$. In FIG. 3, capacitor 74' is shown as being smaller in lateral dimension than capacitor 74, with the result that distance $\Delta X'$ is smaller than distance $\Delta X$. Of course if both capacitors were similarly sized, then both pairs of metal traces could be spacedapart a like distance.

The column-shaped openings, columnar-conductive elements 66, 68, 66', 68', and element pads 70, 72, 70', 72' may be formed using any of the techniques described earlier, after which capacitors 74, 74' are mounted and electrically connected to the relevant element pads.

Modifications and variations may be made to the disclosed embodiments without departing from the subject and spirit of the invention as defined by the following claims.

What is claimed is:

1. An integrated circuit including a $V_{DD}$ pad and a first conductive trace coupled thereto, and a $V_{SS}$ pad and a second conductive trace coupled thereto, and further including at least one commercially available bypass capacitor, the integrated circuit including:

a first columnar electrically conductive element having a first end in electrical contact with at least a portion of said first conductive trace and having a second end extending upward to at least an uppermost surface of said integrated circuit;

a second columnar electrically conductive element having a first end in electrical contact with at least a portion of said second conductive trace and having a second end extending upward to at least said uppermost surface of said integrated circuit;

said second columnar electrically conductive element being spaced-apart laterally from said first columnar conductive element by a distance ΔX corresponding to a lateral distance between first and second connecting pads on said capacitor; and said capacitor having first and second connecting pads spaced-apart laterally said distance ΔX, and being mounted on said uppermost surface directly over said integrated circuit such that said first and second connecting pads on said capacitor directly overlie and make electrical contact with respective uppermost regions of the first and second columnar electrically conductive elements such that electrical contact to said capacitor is made without laterally extending said uppermost regions of said columnar electrically conductive elements.

2. The integrated circuit of claim 1, wherein said first conductive trace and said second conductive trace are formed on different metallization layers within said integrated circuit.

3. The integrated circuit of claim 1, wherein at least one of said first and second columnar electrically conductive elements is formed using a focussed ion beam depositing a metal selecting from the group consisting of (i) tungsten, and (ii) platinum.

4. The integrated circuit of claim 1, wherein at least one of said first and second columnar electrically conductive elements is formed from a material selected from the group consisting of (i) aluminum, (ii) silver, and (iii) doped polysilicon.

5. The integrated circuit of claim 1, wherein said bypass capacitor has at least one characteristic selected from the group consisting of (i) a capacitance ranging from about 1 nF to 100 nF, and (ii) a transverse dimension ranging from about 1.3 mm to about 2.6 mm.

6. The integrated circuit of claim 1, wherein at least one of said first columnar electrically conductive element and said second columnar electrically conductive element is formed during fabrication of said integrated circuit.

7. The integrated circuit of claim 1, wherein at least one of said first columnar electrically conductive element and said second columnar electrically conductive element is formed after fabrication of said integrated circuit.

8. The integrated circuit if claim 1, wherein formation of at least one of said first columnar electrically conductive element and said second columnar electrically conductive element includes forming a column-shaped opening having an inner surface, and then performing at least one process selected from the group consisting of (i) depositing metal along at least an inner surface of said column-shaped opening, (ii) depositing platinum within said column-shaped opening using a focussed ion beam, (iii) depositing tungsten within said column-shaped opening using a focussed ion beam, (iv) depositing a conductive layer along at least an inner surface of said column-shaped opening using sputtering, (v) filling said column-shaped opening with a metal, and (vi) filling said column-shaped opening with polysilicon that is doped.

9. The integrated circuit of claim 1, further including a conductive adhesive disposed between at least one of said connecting pads of said capacitor and an underlying uppermost surface of a said columnar electrically conductive element.

10. The IC of claim 1, wherein formation of at least one of said columnar electrically conductive elements includes forming a column-shaped opening having an inner surface, and then performing at least one process selected from the group consisting of (i) depositing metal along at least an inner surface of said column-shaped opening, (ii) depositing platinum within said column-shaped opening using a focussed ion beam, (iii) depositing tungsten within said column-shaped opening using a focussed ion beam, (iv) depositing a conductive layer along at least an inner surface of said column-shaped opening using sputtering, (v) filling said column-shaped opening with a metal, and (vi) filling said column-shaped opening with polysilicon that is doped.

11. The integrated circuit of claim 9, wherein said conductive adhesive includes a conductive epoxy material.

12. An integrated circuit (IC) including a $V_{DD}$ pad and a first conductive trace coupled thereto, and a $V_{SS}$ pad and a second conductive trace coupled thereto, and further including at least one commercially available bypass capacitor having first and second connecting pads spaced-apart laterally a distance ΔX, said IC including:

a pair of columnar electrically conductive elements, spacedapart laterally from one another said distance ΔX, said elements respectively making electrical contact with said first trace and with second trace, each of said elements having an end extending upward to at least an uppermost surface of said IC; and said bypass capacitor, mounted on said uppermost surface and directly over said IC such that said first and second connecting pads on said capacitor directly overlie and make electrical contact with respective ends of said elements such that electrical contact to said capacitor is made without laterally extending uppermost regions of said elements.

13. The IC of claim 12, wherein said first trace and said second trace are formed on different metallization layers within said IC.

14. The IC of claim 12, wherein at least one of said columnar electrically conductive elements is formed using a focussed ion beam depositing a metal selecting from the group consisting of (i) tungsten, and (ii) platinum.

15. The IC of claim 12, wherein at least one of said columnar electrically conductive elements is formed from a material selected from the group consisting of (i) aluminum, (ii) silver, and (iii) doped polysilicon.

16. An integrated circuit (IC) including a $V_{DD}$ pad and a first conductive trace coupled thereto, and a $V_{SS}$ pad and a second conductive trace coupled thereto, and further including a first commercially available bypass capacitor having first and second connecting pads spaced-apart laterally a distance ΔX1, and a second commercially available bypass capacitor having first and second connecting pads spaced-apart laterally a distance ΔX2, said IC including:

a first pair of columnar electrically conductive elements, spaced-apart laterally from one another by said distance ΔX1, one of said first pair of elements making electrical contact with said first trace and the other of said first pair of elements making electrical contact with said second trace, each of said first pair of elements having an end extending upward to at least an uppermost surface of said IC;

a second pair of columnar electrically conductive elements, spaced-apart laterally from one another by said distance ΔX2, one of said first pair of elements making electrical contact with said first trace and the other of said first pair of elements making electrical contact with said second trace, each of said first pair of elements having an end extending upward to at least an uppermost surface of said IC;

said first bypass capacitor, mounted on said uppermost surface directly over said IC such that said first and second connecting pads directly overlie and make electrical contact with respective first ends of said first pair of columnar electrically conductive elements such that electrical contact to said first bypass capacitor is made without laterally extending said upper-most regions of said first pair of columnar electrically conductive elements; and said second bypass capacitor, mounted on said uppermost surface directly over said IC such that said first and second connecting pads of said second bypass capacitor directly overlie and make electrical contact with respective first ends of said second pair of columnar electrically conductive elements such that said electrical contact to said second bypass capacitor is made without laterally extending said uppermost regions of said second pair of columnar electrically conductive elements.

17. The IC of claim 16, wherein said first trace and said second trace are formed on different metallization layers within said IC.

18. The IC of claim 16, wherein at least one of said pairs of columnar electrically conductive elements is formed using a focussed ion beam depositing a metal selecting from the group consisting of (i) tungsten, and (ii) platinum.

19. The IC of claim 16, wherein at least one of said pairs of columnar electrically conductive elements is formed from a material selected from the group consisting of (i) aluminum, (ii) silver, and (iii) doped polysilicon.

20. The IC of claim 16, wherein formation of at least one of said pairs of columnar electrically conductive elements includes forming a column-shaped opening having an inner surface, and then performing at least one process selected from the group consisting of (i) depositing metal along at least an inner surface of said column-shaped opening, (ii) depositing platinum within said column-shaped opening using a focussed ion beam, (iii) depositing tungsten within said column-shaped opening using a focussed ion beam, (iv) depositing a conductive layer along at least an inner surface of said column-shaped opening using sputtering, (v) filling said column-shaped opening with a metal, and (vi) filling said column-shaped opening with polysilicon that is doped.

* * * * *